(12) United States Patent
Liang et al.

(10) Patent No.: US 11,742,467 B2
(45) Date of Patent: Aug. 29, 2023

(54) BACKPLANE, PREPARATION METHOD WITH DUAL DAMASCENE STEPS

(71) Applicant: BOE Technology Group Co., Ltd., Beijing (CN)

(72) Inventors: Zhiwei Liang, Beijing (CN); Wenqian Luo, Beijing (CN); Yingwei Liu, Beijing (CN); Ke Wang, Beijing (CN); Shengguang Ban, Beijing (CN); Zhanfeng Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 121 days.

(21) Appl. No.: 16/920,401

(22) Filed: Jul. 2, 2020

(65) Prior Publication Data
US 2021/0036196 A1 Feb. 4, 2021

(30) Foreign Application Priority Data
Aug. 1, 2019 (CN) .......................... 201910708843.X

(51) Int. Cl.
*H01L 33/62* (2010.01)
*H01L 23/00* (2006.01)

(52) U.S. Cl.
CPC ............. *H01L 33/62* (2013.01); *H01L 24/16* (2013.01); *H01L 2224/16225* (2013.01); *H01L 2933/0066* (2013.01)

(58) Field of Classification Search
CPC ........... H01L 33/62; H01L 2224/16225; H01L 2933/0066; H01L 27/153; H01L 27/156; H01L 27/124; H01L 27/1244; H01L 25/075; H01L 25/0753; H01L 25/0756; H01L 21/76883; H01L 2224/03831; H01L 2224/03848; H01L 2224/03901; G02F 1/133603; G02F 1/133612
See application file for complete search history.

(56) References Cited

U.S. PATENT DOCUMENTS

2001/0017422 A1* 8/2001 Oda .................. H01L 21/76877 257/E21.585
2005/0164592 A1* 7/2005 Lee .................. H01L 21/76877 445/35
(Continued)

FOREIGN PATENT DOCUMENTS

CN 103151359 A 6/2013
CN 107026121 A 8/2017
(Continued)

OTHER PUBLICATIONS

Office Action dated Feb. 25, 2022 for Chinese Patent Application No. 201910708843.X and English Translation.

*Primary Examiner* — Didarul A Mazumder
*Assistant Examiner* — Gustavo G Ramallo
(74) *Attorney, Agent, or Firm* — Ling Wu; Stephen Yang; Ling and Yang Intellectual Property

(57) ABSTRACT

A preparation method of a backplane includes: forming an insulating structure layer having a groove on a base substrate by a mask exposure process, the groove being used for accommodating a metal trace; and repeating a metal sub-layer forming step including an ashing process and a wet etching process multiple times to form the metal trace positioned in the groove.

17 Claims, 11 Drawing Sheets

(56) References Cited

U.S. PATENT DOCUMENTS

| | | | |
|---|---|---|---|
| 2016/0035924 A1* | 2/2016 | Oraw | H01L 31/0508 |
| | | | 257/89 |
| 2016/0091765 A1 | 3/2016 | Choi et al. | |
| 2018/0350674 A1* | 12/2018 | Uzoh | H01L 21/3212 |
| 2019/0252417 A1* | 8/2019 | Xu | H01L 21/28008 |
| 2019/0333805 A1* | 10/2019 | O'Toole | H01L 21/76813 |
| 2019/0333940 A1 | 10/2019 | Zeng et al. | |
| 2019/0341406 A1 | 11/2019 | Liu et al. | |

FOREIGN PATENT DOCUMENTS

| | | | |
|---|---|---|---|
| CN | 107910336 A | 4/2018 | |
| CN | 207517287 U | 6/2018 | |
| EP | 0572121 A2 * | 12/1993 | H05K 3/00 |
| EP | 0572121 A2 | 12/1993 | |

\* cited by examiner

BACKPLANE, PREPARATION METHOD WITH DUAL DAMASCENE STEPS

CROSS-REFERENCE TO RELATED APPLICATION

The present application claims the priority to the Chinese Patent Application No. 201910708843.X, filed to the CNIPA on Aug. 1, 2019, the content of which is hereby incorporated by reference.

TECHNICAL FIELD

The present disclosure relates to, but is not limited to the field of display technology, specifically to a backplane, a preparation method thereof, a backlight module and a display device.

BACKGROUND

Mini-LED refers to an LED with a size between 80 µm and 300 µm for display applications, also known as a submillimeter light emitting diode. Mini-LED has two main applications in display. One is used for self-luminous LED display. Compared with small pitch LEDs, Mini-LEDs can achieve smaller dot pitch display on a chip of the same size. The other is applied to a backlight module of a Liquid Crystal Display (LCD). Compared with the traditional edge-lit LED backlight module, the direct-lit Mini-LED backlight module can reduce the light mixing distance by a denser chip arrangement, thus achieving an ultra-thin backlight module. In addition, cooperating with local dimming control, Mini-LED will have better contrast and High-Dynamic Range (HDR) image display effect. The LCD display screen with Mini-LED backlight is far superior to the current LCD display in brightness, contrast, color restoration and power consumption. It can even compete with the Active Matrix Organic Light-emitting Diode (AMOLED) in contrast, power consumption and the like. Besides, the production cost can also be controlled by using the current LCD production line.

Mini-LED is a current-driven self-luminous element. Therefore, the Mini-LED backlight module needs metal traces with low resistivity. Considering the resistivity and the cost of conductor materials, copper is generally used as the metal trace of Mini-LED backlight module. For LCD displays with medium-sized or large-sized Mini-LED backlight modules, due to the large size of the backlight module, the voltage drop of current on copper traces is very significant, therefore thicker copper metal traces need to be used.

SUMMARY

The following is a summary of the subject matter described in detail herein. This summary is not intended to limit the scope of protection of the claims.

In an aspect, an embodiment of the disclosure provides a preparation method of a backplane, comprising: forming an insulating structure layer having a groove on a base substrate by a mask exposure process, wherein the groove is used for accommodating a metal trace; and repeating a metal sub-layer forming step including an ashing process and a wet etching process multiple times to form the metal trace positioned in the groove.

In some possible implementations, a sidewall of the groove is perpendicular to a surface of the base substrate.

In some possible implementations, the metal sub-layer forming step comprises: depositing a metal thin film on the base substrate on which the groove is formed; forming a photoresist layer on the metal thin film; ashing the photoresist layer to make the photoresist positioned outside the groove be removed and a part of the photoresist at the groove be retained; and etching the metal thin film by a wet etching process and peeling the remaining photoresist to form a metal sub-layer positioned in the groove.

In some possible implementations, the preparation method of the backplane further comprises: depositing a metal thin film on a base substrate on which the metal sub-layer is formed; forming a photoresist layer on the metal thin film; processing the photoresist layer by a mask exposure process to remove the photoresist positioned outside the groove and retain the photoresist at the groove; and etching the metal thin film by a wet etching process and peeling the remaining photoresist to form another metal sub-layer positioned in the groove.

In some possible implementations, the forming an insulating structure layer having a groove on a base substrate by a mask exposure process comprises: forming an insulating structure thin film on a base substrate; coating a layer of photoresist on the insulating structure thin film; exposing and developing the photoresist by a mask exposure process to make the photoresist positioned outside the groove be retained and the photoresist at the groove be removed; and etching the insulating structure thin film at the groove to form an insulating structure layer having a groove.

In some possible implementations, the forming an insulating structure layer having a groove on a base substrate by a mask exposure process comprises: forming an organic thin film on the base substrate; forming a passivation thin film on the organic thin film; coating a layer of photoresist on the passivation thin film; exposing and developing the photoresist by a mask exposure process to make the photoresist positioned outside the groove be retained and the photoresist at the groove be removed; etching the passivation thin film positioned at the groove by a first dry etching process to form a first sub-groove for exposing the organic thin film; and etching the organic thin film exposed through the first sub-groove by a second dry etching process to form a second sub-groove, wherein the groove comprises the second sub-groove and the first sub-groove.

In some possible implementations, the depth of the groove is greater than 3 µm.

In some possible implementations, the thickness of the metal thin film is less than or equal to 1 µm.

In some possible implementations, the metal sub-layer forming step is repeated 3 times.

In some possible implementations, the metal sub-layer forming step is repeated twice.

In some possible implementations, the material of the organic thin film comprises polyimide, and the material of the passivation thin film comprises at least one of silicon nitride, silicon oxide and silicon oxynitride.

An embodiment of the disclosure also provides a backplane prepared by an aforementioned method.

An embodiment of the disclosure also provides a backplane prepared by an aforementioned method, wherein an upper surface of the metal trace is lower than an upper surface of the insulating structure layer, and a trough is provided between the metal trace and a sidewall of the groove.

An embodiment of the disclosure also provides a backplane prepared by an aforementioned method, wherein an upper surface of the metal trace is higher than an upper surface of the insulating structure layer, and a trough is provided at the center of the metal trace.

An embodiment of the disclosure also provides a backplane prepared by an aforementioned method, wherein the depth of the groove is greater than 3 μm.

An embodiment of the disclosure also provides a backlight module comprising the backplane described above and an LED provided on the backplane and electrically connected with the metal trace.

An embodiment of the disclosure also provides a display device comprising the backlight module described above.

Other features and advantages of technical solutions of the present disclosure will be set forth in the description which follows, and in part will become apparent from the description, or be learned by practice of the technical solutions of the present disclosure. Purposes and advantages of the technical solutions of the present disclosure may be realized and obtained by structures specifically indicated in the description, claims and drawings.

BRIEF DESCRIPTION OF DRAWINGS

Accompanying drawings are used to provide a further understanding of technical solutions of the present disclosure, form a part of the specification, and are used to explain technical solutions of the present disclosure together with embodiments of the present disclosure, but do not constitute a limitation on the technical solutions of the present disclosure.

FIG. 2 is a schematic diagram of a preparation method of a backplane in an exemplary embodiment of the disclosure;

FIG. 6c-1, FIG. 6d-1 and FIG. 6e-1 are schematic structural diagrams of the process of forming a third metal sub-layer in an exemplary embodiment, respectively;

FIG. 6c-2, FIG. 6d-2 and FIG. 6e-2 are schematic structural diagrams of the process of forming a third metal sub-layer in an exemplary embodiment, respectively;

FIG. 7 is a schematic structural diagram of a Mini-LED after being electrically connected with the copper metal trace in FIG. 6e-1; and FIG. 8 is a schematic structural diagram of a Mini-LED after being electrically connected with the copper metal trace in FIG. 6e-2.

DETAILED DESCRIPTION

Figure 1:
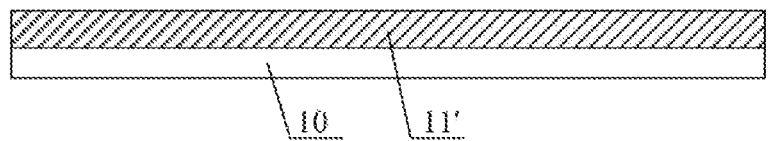
FIGS. 1-1 to 1-11 are schematic diagrams of a process of preparing a copper metal trace by a sputtering process.

In order to make purposes, technical solutions and advantages of the present disclosure clearer, embodiments of the present disclosure will be described in detail below with reference to the accompanying drawings. It should be noted that embodiments in the present disclosure and features in the embodiments may be combined with each other arbitrarily if there is no conflict.

Mini-LED is a current-driven self-luminous element. Therefore, the Mini-LED backlight module needs metal traces with low resistivity. Considering the resistivity and the cost of conductor materials, copper is generally used as the metal trace of Mini-LED backlight module. For LCD displays with medium-sized or large-sized Mini-LED backlight modules, due to the large size of the backlight module, there is a significant voltage drop of current on copper traces, therefore thicker copper metal traces need to be used. Taking a computer display screen of 18.5 inch (1920*1080) as an example, the LED direct-lit backlight module needs at least about 6,000 LEDs in total. In order to meet the current demand and control the effect of LED heating during operation, assuming that the copper traces have the same trace width, the thickness of copper should be greater than 3.0 μm.

The simplest method of making thicker copper traces is electroplating. However, electroplating equipment and electroplating process cannot meet the requirements of existing LCD large generation lines. For example, the size of the glass substrate of G8.5 strip line reaches 2.5 m*2.2 m, and it is very difficult to make thicker copper metal traces on such a large glass substrate by an electroplating process. In an exemplary embodiment, the thickness of the metal copper traces is 3 μm by using a sputtering equipment of an existing LCD production line and multiple times of coating and etching.

When a 3 μm thick copper metal trace is manufactured by a sputtering equipment, three mask exposure processes are required, thus greatly increasing the preparation cost of the copper metal trace. Moreover, every time the resin layer is manufactured, a certain temperature and time are required for curing, and copper oxidation will be caused by the curing process of the resin layer, thus increasing the resistance of the copper metal trace.

When copper metal traces are made on a glass substrate by a sputtering process, if the thickness of one-time deposited copper is greater than 10,000 angstroms, glass may be broken due to the stress of the glass substrate, limitations of the sputtering equipment and other reasons, resulting in equipment downtime. Therefore, in the process of making thick copper by the sputtering process, the thickness of one-time deposited copper needs to be strictly controlled, and the upper limit of the thickness of one-time deposited copper by the sputtering process is 10,000 angstroms. Therefore, in order to produce 3 μm thick copper, copper needs to be deposited 3 times.

FIGS. 1-1 to 1-11 are schematic diagrams of a process of preparing a copper metal trace by a sputtering process. As shown in FIGS. 1-1 to 1-11, the method of preparing a copper metal trace by a sputtering process may include the following three patterning processes.

Figures 1, 2:
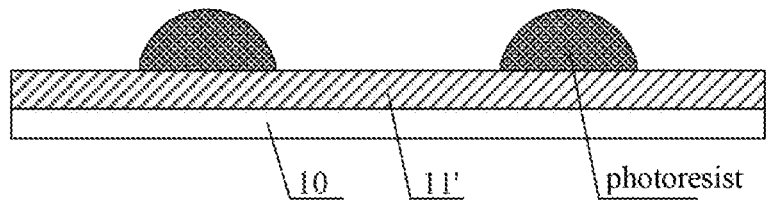
Figures 1, 2, 3:
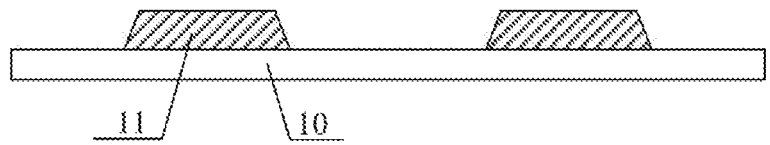
Figures 1, 2, 3, 4:
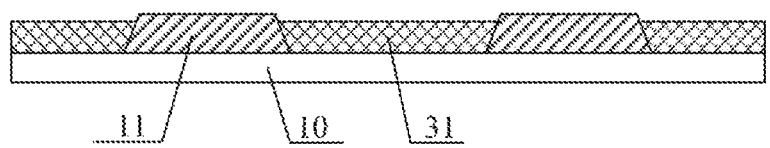
Figures 1, 2, 3, 4, 5:
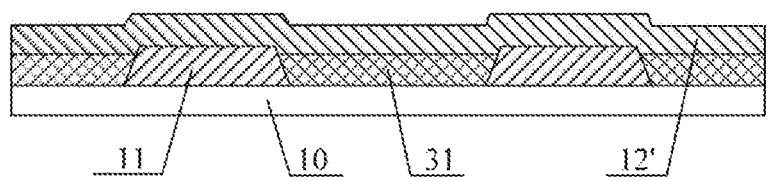
Figures 1, 2, 3, 4, 5, 6:
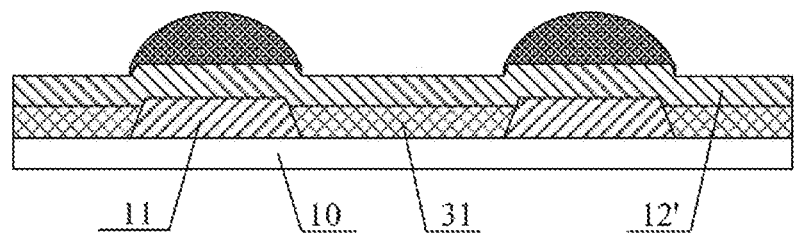

The first patterning process: depositing a 10,000 angstroms thick copper metal thin film 11' on a base substrate 10 by sputtering, as shown in FIG. 1-1; coating a layer of photoresist on the copper metal thin film 11', exposing and developing the photoresist by using a mask plate to form an unexposed area at a position where a copper metal trace is to be formed with the photoresist retained, and form fully exposed areas at other positions without photoresist so as to expose the copper metal thin film, as shown in FIG. 1-2; etching the copper metal thin film in the fully exposed areas and peeling the remaining photoresist to form a first copper metal layer 11 with a thickness of 10,000 angstroms, as shown in FIG. 1-3; coating and curing a resin thin film on the base substrate 10 on which the first copper metal layer 11 is formed to form a first resin layer 31, the thickness of which is less than that of the first copper metal layer 11, so that the upper surface of the first copper metal layer 11 is exposed, as shown in FIG. 1-4.

The second patterning process: depositing a 10,000 angstroms thick copper metal thin film 12' on the base substrate on which the first resin layer 31 is formed by sputtering, as shown in FIG. 1-5; coating a layer of photoresist on the copper metal thin film 12', exposing and developing the photoresist by using a mask plate to form an unexposed area at a position where the copper metal trace is to be formed with the photoresist retained, and form fully exposed areas at other positions without photoresist so as to expose the copper metal thin film, as shown in FIG. 1-6; etching the copper metal thin film in the fully exposed areas and peeling the remaining photoresist to form a second copper metal layer 12 with a thickness of 10,000 angstroms, as shown in FIG. 1-7; coating and curing a resin thin film on the base substrate 10 on which the second copper metal layer 12 is formed to form a second resin layer 32, the thickness of which is less than that of the second copper metal layer 12, so that the upper surface of the second copper metal layer 12 is exposed, as shown in FIG. 1-8.

The Third patterning process: depositing a 10,000 angstroms thick copper metal thin film 13' on the base substrate on which the second resin layer 32 is formed by sputtering, as shown in FIG. 1-9; coating a layer of photoresist on the copper metal thin film 13', exposing and developing the photoresist by using a mask plate to form an unexposed area at a position where the copper metal trace is to be formed with the photoresist retained, and form fully exposed areas at other positions without photoresist so as to expose the copper metal thin film, as shown in FIG. 1-10; etching the copper metal thin film in the fully exposed areas and peeling the remaining photoresist to form a third copper metal layer 13 with a thickness of 10,000 angstroms, as shown in FIG. 1-11; coating and curing a resin thin film on the base substrate 10 on which the third copper metal layer 13 is formed to form a third resin layer 33, the thickness of which is less than that of the third copper metal layer 13, so that the upper surface of the third copper metal layer 13 is exposed, as shown in FIG. 1-11.

As shown in FIG. 1-11, the first copper metal layer 11, the second copper metal layer 12, and the third copper metal layer 13 are sequentially stacked to form a copper metal trace with a thickness of 3 μm.

The above method for preparing a 3 μm thick copper metal trace adopts a three-time exposure process and three mask plates, thus greatly increasing the preparation cost of the thicker copper metal trace. In addition, in the process of forming the first resin layer, the second resin layer and the third resin layer, the resin film needs to be heated and cured. The heating process will cause oxidation of copper metal, which increases the resistance of the copper metal trace. Even if a composite copper metal thin film of Cu/MoNb (a thin film formed by a combined deposition method of depositing Cu first and then depositing MoNb on the copper thin film) is adopted, oxidation of the copper metal cannot be avoided.

An embodiment of the present disclosure provides a preparation method of a backplane. The preparation method of the backplane comprises: forming an insulating structure layer having a groove on a base substrate by a mask exposure process, wherein the groove is used for accommodating a metal trace; repeating a metal sub-layer forming step including an ashing process and a wet etching process multiple times to form a metal trace positioned in the groove.

According to the preparation method of the backplane of the embodiment of the present disclosure, only one mask exposure process is required in the process of forming the metal trace, thus simplifying the process flow for preparing the metal trace, reducing the times of mask exposure and the preparation cost of the metal trace. In addition, the preparation method of the backplane also reduces the times of heating and curing, avoids oxidation of the metal trace in the heating and curing process, maintains the low resistance of the metal trace, and improves the preparation yield and bonding yield of products.

FIG. 2 is a schematic diagram of a preparation method of a backplane in an exemplary embodiment of the disclosure. The preparation method of the backplane comprises:

S1: forming an insulating structure layer having a groove on a base substrate by a mask exposure process, wherein the groove is used for accommodating a metal trace; and S2: repeating a metal sub-layer forming step including an ashing process and a wet etching process multiple times to form a metal trace positioned in the groove.

In an exemplary embodiment, the sidewall of the groove is perpendicular to a surface of the base substrate.

In an exemplary embodiment, the depth of the groove is greater than 3 μm.

In an exemplary embodiment, the metal sub-layer forming step includes: depositing a metal thin film on the base substrate on which the groove is formed; forming a photoresist layer with a flat surface on the metal thin film; ashing the photoresist layer to make the photoresist positioned outside the groove be removed and a part of the photoresist at the groove be retained; and etching the metal thin film by a wet etching process and peeling the remaining photoresist to form a first metal sub-layer positioned in the groove.

In an exemplary embodiment, the thickness of the metal thin film is less than or equal to 1 μm.

In an exemplary embodiment, the metal sub-layer forming step is repeated 2 or 3 times.

In an exemplary embodiment, the preparation method of the backplane may further include: depositing a metal thin film on a base substrate on which the metal sub-layer is formed; forming a photoresist layer with a flat surface on the metal thin film; processing the photoresist layer by a mask exposure process to remove the photoresist positioned outside the groove and retain the photoresist at the groove; and etching the metal thin film by a wet etching process and peeling the remaining photoresist to form a metal sub-layer positioned in the groove.

In an exemplary embodiment, step S1 may include: forming an insulating structure thin film on a base substrate; coating a layer of photoresist on the insulating structure thin film; exposing and developing the photoresist by a mask exposure process to retain the photoresist positioned outside the groove while without photoresist at the groove; and etching the insulating structure thin film at the groove to form an insulating structure layer having a groove.

In an exemplary embodiment, step S1 may include: forming an organic thin film on a base substrate; forming a passivation thin film on the organic thin film; coating a layer of photoresist on the passivation thin film; exposing and developing the photoresist by a mask exposure process to retain the photoresist positioned outside the groove while without photoresist at the groove; etching the passivation thin film positioned at the groove by a first dry etching process to form a first sub-groove for exposing the organic thin film; and etching the organic thin film exposed through the first sub-groove by a second dry etching process to form a second sub-groove, wherein the groove comprises the second sub-groove and the first sub-groove.

In an exemplary embodiment, the material of the organic thin film comprises polyimide, and the material of the passivation thin film comprises at least one of silicon nitride, silicon oxide and silicon oxynitride.

Mini-LED is a current-driven self-luminous element. Therefore, the Mini-LED backlight requires metal wires with low resistivity. Considering the resistivity and the cost of conductor materials, copper is generally used as the metal trace of Mini-LED backlight module. In the Mini-LED backplane, the thickness of the copper metal trace is about 3 μm. When preparing a 3 μm copper metal trace on the backplane by the prior art, multiple mask exposure processes are required, resulting in higher preparation cost of the backplane. Moreover, in the process of preparing the copper metal trace, the oxidation of copper easily occurs, and the resistance of the copper metal trace is increased.

Figure 3A:
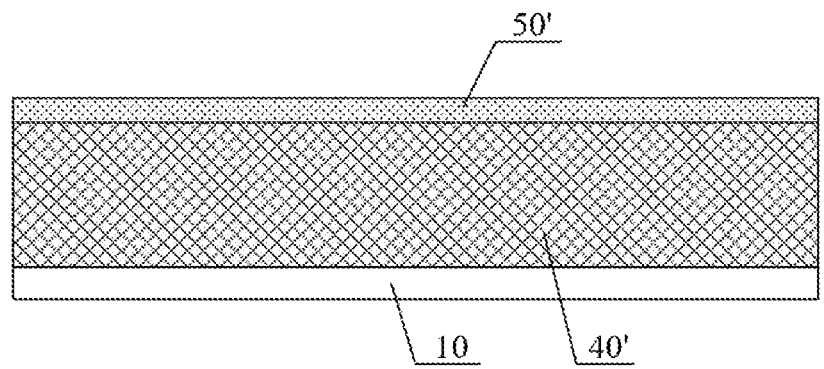
FIGS. 3a to 3c are schematic structural diagrams of the process of forming an insulating structure layer in a backplane.
Figure 3B:
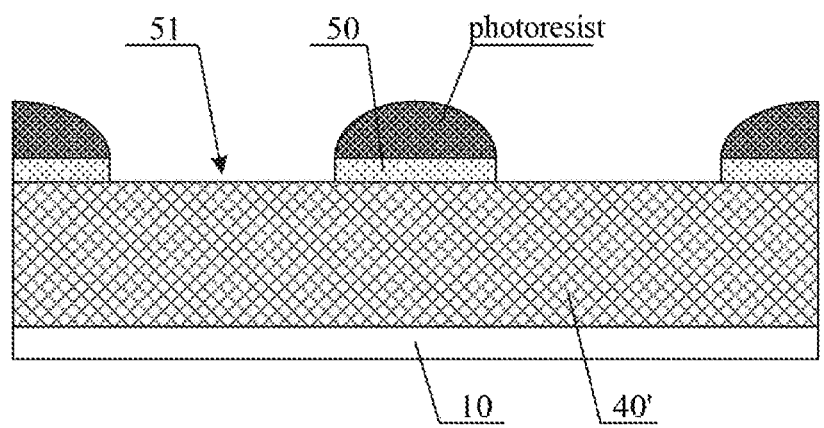
Figure 3C:
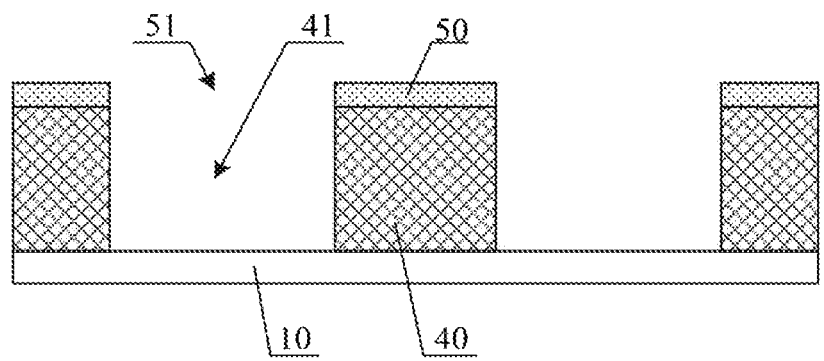

The technical scheme of the present disclosure will be described in detail below by an example of a preparation process of preparing a copper metal trace with a thickness of 3 μm on a backplane. A person skilled in the art can understand that in practice, the material of the metal trace is not limited to copper, and it may be selected as required. The thickness of the metal trace is not limited to 3 μm. In actual situations, the thickness of the metal trace can be set as required. FIGS. 3a to 3c are schematic structural diagrams of the process of forming an insulating structure layer in a backplane. FIGS. 4a to 4e are schematic structural diagrams of the process of forming a first metal sub-layer in a backplane. FIGS. 5a to 5e are schematic structural diagrams of the process of forming a second metal sub-layer in a backplane. FIG. 6a is a schematic structural diagram of a backplane after the formation of a third copper metal thin film. FIG. 6b is a schematic structural diagram of a backplane after the formation of photoresist on a third copper metal thin film. FIG. 6c-1, FIG. 6d-1 and FIG. 6e-1 are schematic structural diagrams of the process of forming a third metal sub-layer in an exemplary embodiment, respectively.

In an exemplary embodiment, the preparation process of the backplane includes the following operations S1-S2.

S1: forming an insulating structure layer having a groove on a base substrate by a mask exposure process, wherein the groove is used for accommodating a metal trace. This step may include: forming an insulating structure thin film on a base substrate; coating a layer of photoresist on the insulating structure thin film; exposing and developing the photoresist by a mask exposure process to retain the photoresist positioned outside the groove while without photoresist at the groove; and etching the insulating structure thin film at the groove to form an insulating structure layer having a groove.

In an exemplary embodiment, forming an insulating structure thin film on a base substrate may include: forming an organic thin film on the base substrate; and forming a passivation thin film on the organic thin film. Therefore, the insulating structure thin film includes an organic thin film and a passivation thin film which are stacked. In order to form a 3 μm thick copper metal trace in the groove, the depth of the groove needs to be greater than 3 μm. It is easier to form a thickness greater than 3 μm using an organic thin film, thus forming a groove greater than 3 μm more easily. A person skilled in the art can understand that the insulating structure layer with a groove can also be formed of an inorganic material. For example, the insulating structure layer can be one of SiNx, SiOx and SiNx/SiOx composite layer, so long as the thickness of the insulating structure layer is appropriate to form a groove with a corresponding depth. In an exemplary embodiment, the insulating structure layer includes an organic layer and a passivation layer, and the organic thin film is easy to form a thicker thickness, thereby facilitating the formation of a groove with appropriate depth.

Etching the insulating structure thin film at the groove to form an insulating structure layer having a groove may include: etching the passivation thin film positioned at the groove by a first dry etching process to form a first sub-groove for exposing the organic thin film; etching the organic thin film exposed through the first sub-groove by a second dry etching process to form a second sub-groove, wherein the groove comprises the second sub-groove and the first sub-groove. Therefore, the groove includes a first sub-groove and a second sub-groove, and the first sub-groove and the second sub-groove coincide. When etching the organic thin film, photoresist cannot be used as a mask. Therefore, in an exemplary embodiment, a passivation thin film is provided on the organic thin film, so that after etching the passivation thin film, the formed passivation layer with the first sub-groove can be used as an etching mask of the organic thin film to complete etching of the organic thin film.

Therefore, in an exemplary embodiment of the present disclosure, step S1 may include: coating a layer of organic solvent on the base substrate 10, and forming an organic thin film 40' after curing the organic solvent; depositing a passivation material on the organic thin film 40' to form a passivation thin film 50', as shown in FIG. 3a; coating a layer of photoresist on the passivation thin film 50', exposing and developing the photoresist by mask exposure to form a fully exposed area at the groove (i.e., a position where the copper metal trace is to be formed) without photoresist so as to expose the passivation thin film, and form unexposed areas at other positions with the photoresist retained; etching the passivation thin film positioned at the groove by a first dry etching process to form a first sub-groove 51 for exposing the organic thin film 40', thereby forming a passivation layer 50, as shown in FIG. 3b; etching the organic thin film exposed through the first sub-groove 51 by a second dry etching process to form a second sub-groove 41, thereby forming an organic layer 40, as shown in FIG. 3c. When the organic thin film is etched by the second dry etching process, the sidewall of the formed second sub-groove 41 will be perpendicular to the surface of the base substrate 10, thereby forming a vertical groove. Grooves with such shape are conducive to the formation of metal traces and stabilize the resistance and shape of metal traces. When the organic thin film is etched by the second dry etching process, the passivation layer 50 having the first sub-groove 51 serves as an etching mask. The second dry etching process does not cause damage to the passivation layer 50, and in the second dry etching process, the photoresist layer on the passivation layer 50 is simultaneously etched and removed to form an insulating structure layer as shown in FIG. 3c. The insulating structure layer includes the organic layer 40 on the base substrate 10 and the passivation layer 50 on the organic layer 40. The insulating structure layer is provided with a groove, and the groove includes the second sub-groove 41 and the first sub-sub-groove 51 which are overlapped.

In order to obtain an organic thin film with a thickness of 3 μm, the thickness of the coated organic solvent may be 3.8 μm to 4.0 μm, so that the thickness of the organic thin film 40' formed after curing is about 3 μm. In actual implementation, the thickness of the organic thin film can be specifically determined according to the thickness of the metal trace so as to form a groove with appropriate depth. The material of the organic thin film may be a resin material such as polyimide. The thickness of the passivation thin film 50' is about 1,000 angstroms, and the passivation thin film 50' may be one of SiNx, SiOx and SiNx/SiOx composite layer. The passivation layer is used as a mask for the second dry etching process, and the thickness of the passivation thin film can be greater than or equal to 1,000 angstroms to ensure the proper thickness of the mask. The second dry etching process includes an etching process using oxygen plasma, so that a second sub-groove 41 perpendicular to the base substrate 10 can be obtained.

S2: repeating a metal sub-layer forming step including an ashing process and a wet etching process multiple times to form a metal trace positioned in the groove. The metal sub-layer forming step may include: depositing a metal thin film on a base substrate on which the groove is formed; forming a photoresist layer with a flat surface on the metal thin film; ashing the photoresist layer to make the photoresist positioned outside the groove be removed and a part of the photoresist at the groove be retained; etching the metal thin film by a wet etching process and peeling the remaining photoresist to form a metal sub-layer positioned in the groove.

In order to obtain a copper metal trace with a thickness of 3 μm, in an exemplary embodiment, the thickness of the metal sub-layer is about 1 μm, and the metal sub-layer forming step is repeated three times to obtain a metal trace with a thickness of 3 μm.

Therefore, in an exemplary embodiment of the present disclosure, step S2 may include the following operations S21-S26.

Figure 4A:
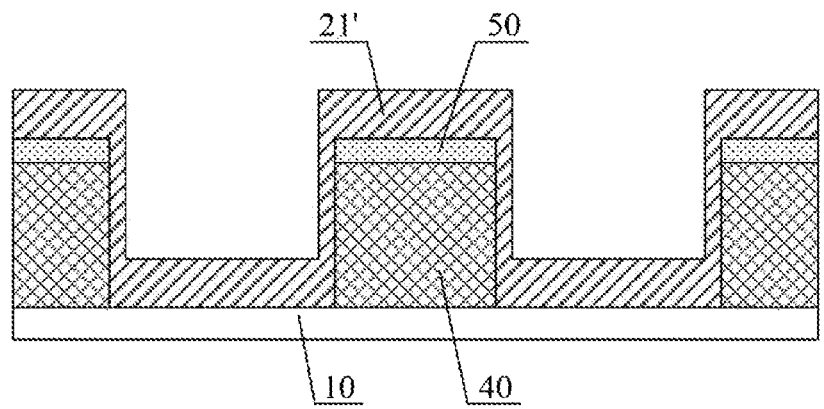
FIGS. 4a to 4e are schematic structural diagrams of the process of forming a first metal sub-layer in a backplane.

S21: depositing a first copper metal thin film 21' on the base substrate 10 on which a groove is formed, as shown in FIG. 4a.

Figure 4B:
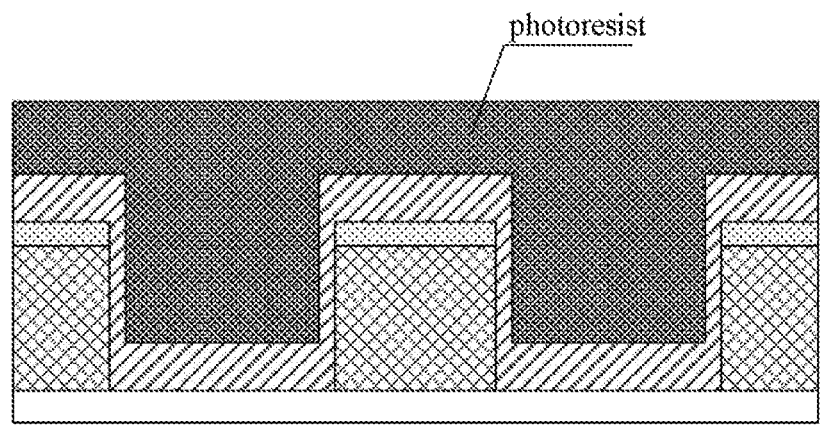

S22: forming a photoresist with a flat surface on the first copper metal thin film 21' by coating, as shown in FIG. 4b.

Figure 4C:
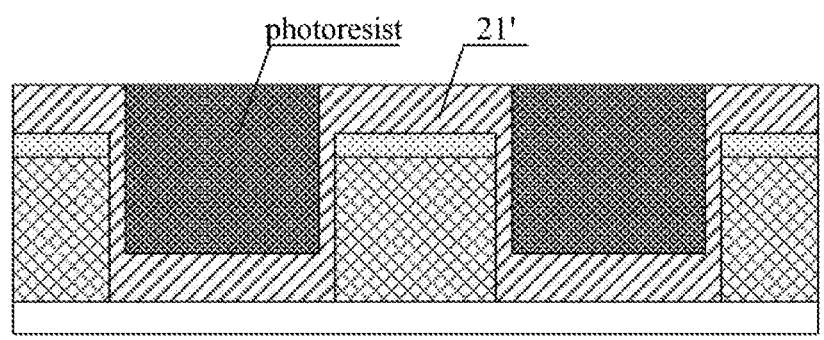

S23: ashing the photoresist, such that the photoresist positioned outside the groove is removed to expose the first copper metal thin film 21' positioned outside the groove, and a part of the photoresist at the groove is retained, as shown in FIG. 4c.

Figure 4D:
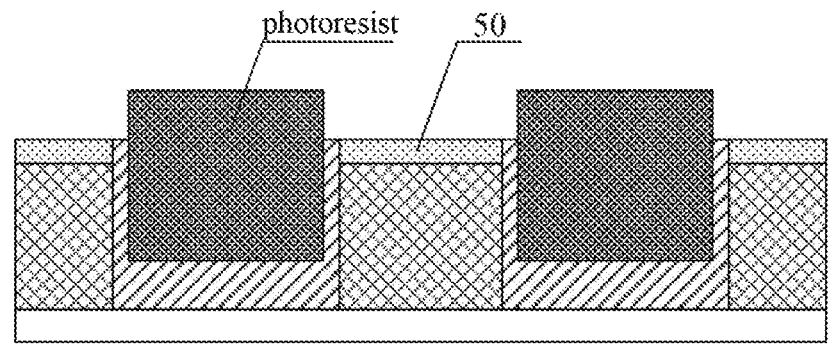
Figure 4E:
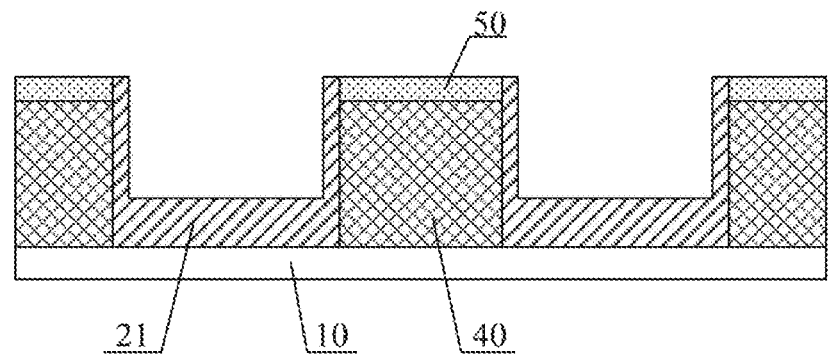

S24: etching the first copper metal thin film by a wet etching process to remove the first copper metal thin film positioned outside the groove and expose the insulating layer 50, as shown in FIG. 4d; and removing the remaining photoresist to obtain a first metal sub-layer 21, as shown in FIG. 4e.

The groove is relatively deep, and in order to obtain a flat surface when coating the photoresist, the photoresist needs to be coated twice or more. When ashing the photoresist, the photoresist is entirely thinned until the photoresist positioned outside the groove is completely removed to expose the first copper metal thin film. At this time, due to the relatively large thickness of photoresist at the groove, photoresist is still retained at the groove. Ashing process includes an etching process using oxygen plasma.

Figure 5A:
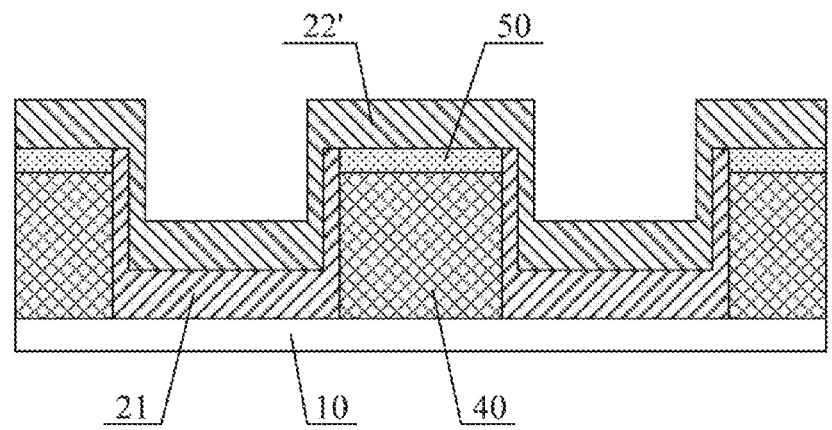
FIGS. 5a to 5e are schematic structural diagrams of the process of forming a second metal sub-layer in a backplane.
Figure 5B:
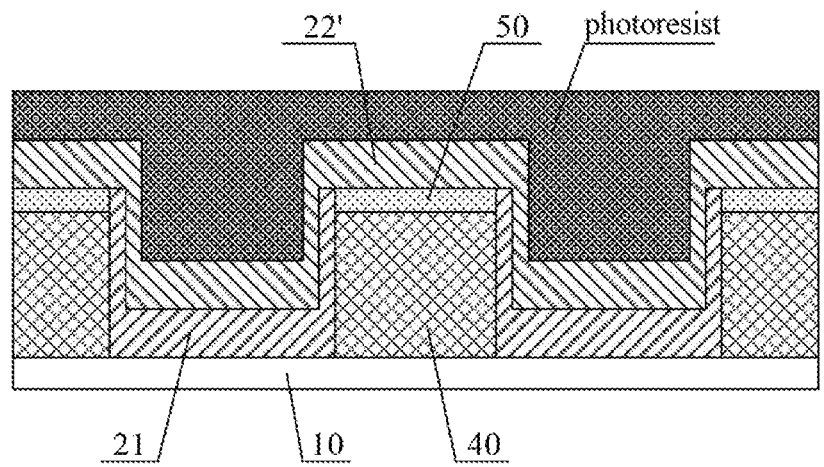
Figure 5C:
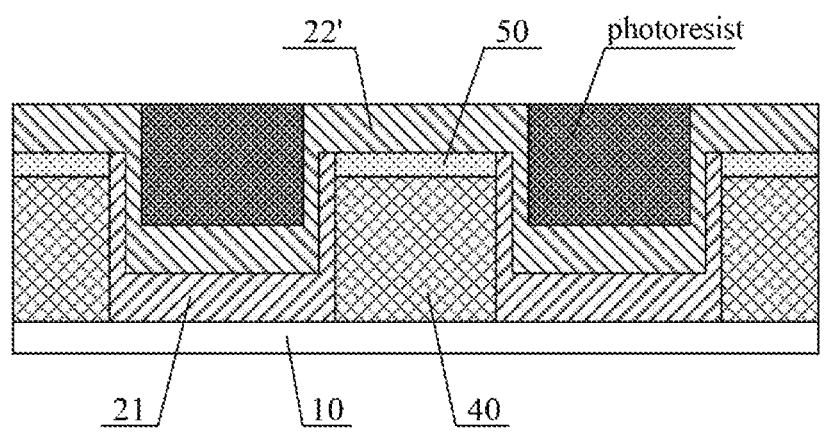
Figure 5D:
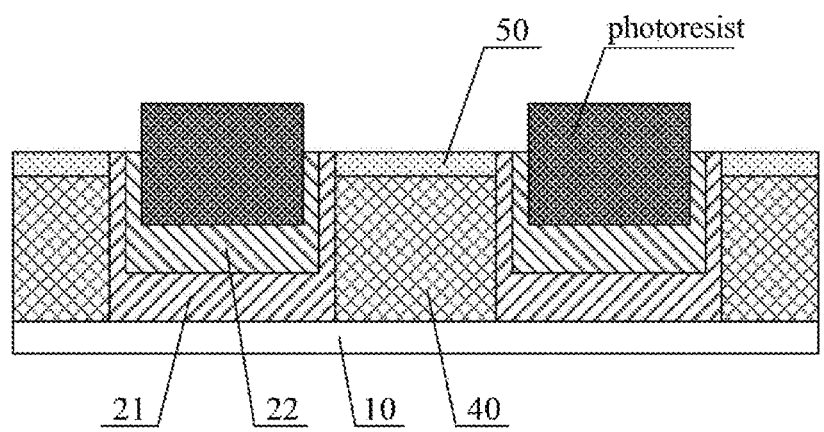
Figure 5E:
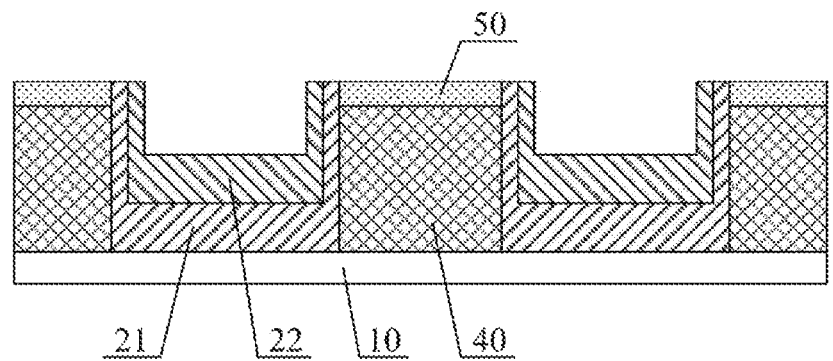
Figure 6A:
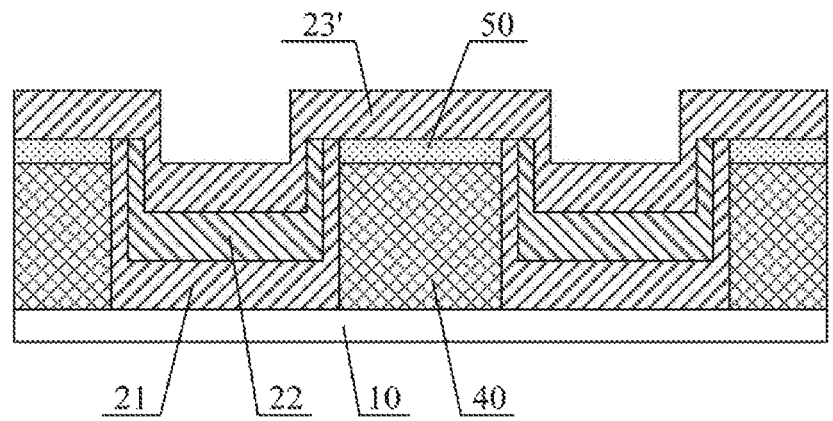
FIG. 6a is a schematic structural diagram of a backplane after the formation of a third copper metal thin film.
Figure 6B:
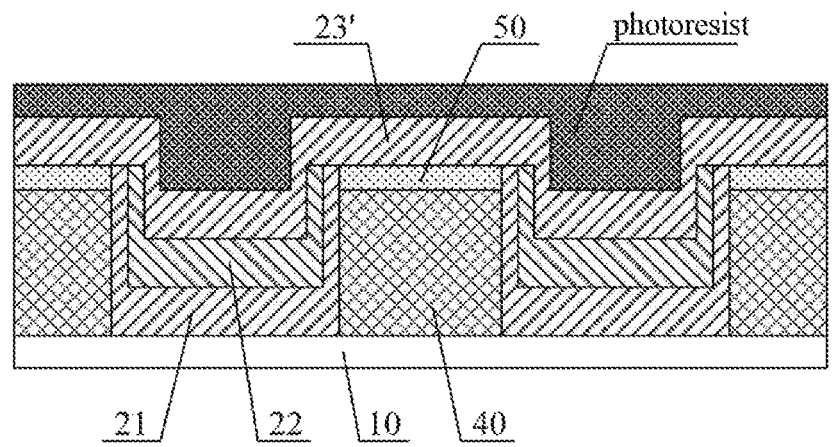
FIG. 6b is a schematic structural diagram of a backplane after the formation of a photoresist on the third copper metal thin film.

S25: sequentially executing S21 to S24 for the second time to form structures as shown in FIGS. 5a, 5b, 5c, 5d and 5e, respectively. As shown in FIG. 5e, the second metal sub-layer 22 is stacked on the first metal sub-layer 21. 22' represents a second copper metal thin film.

Figures 1, 6C:
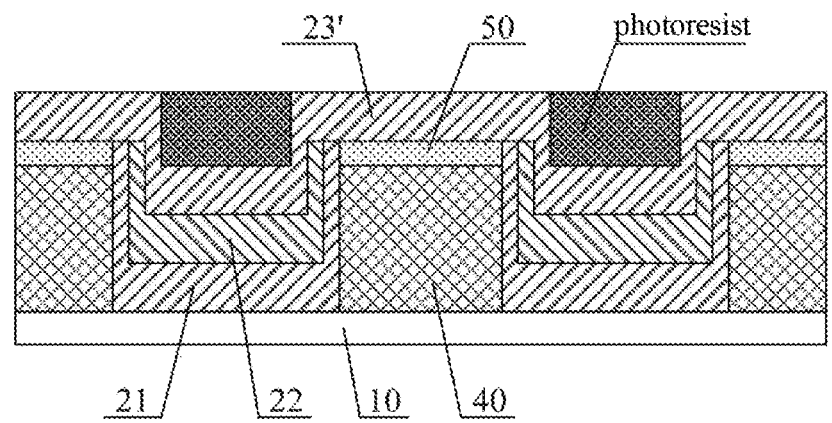
Figures 1, 6D:
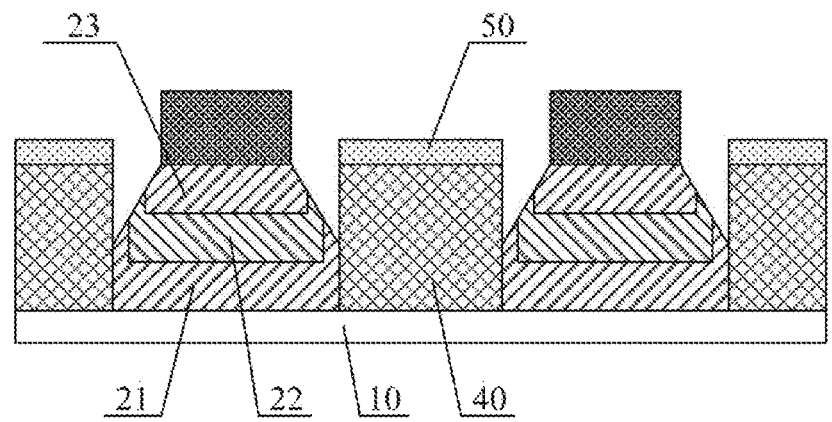
Figures 1, 6E:
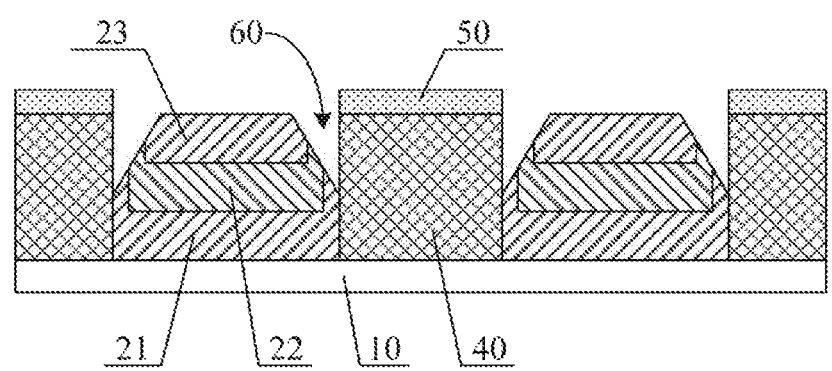
Figures 2, 6C:
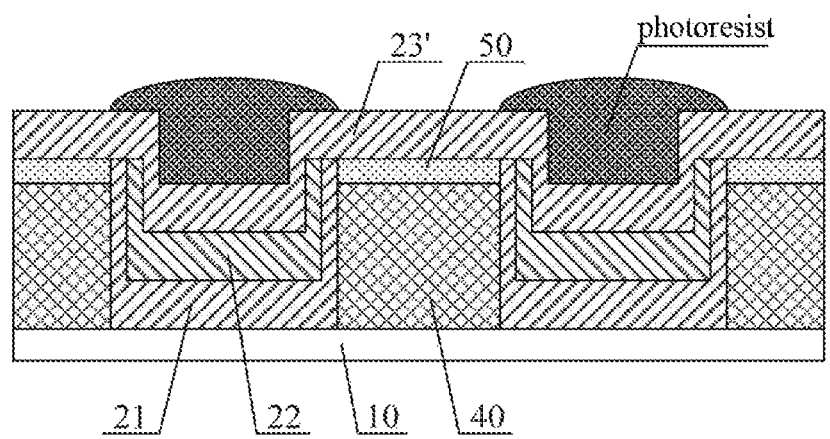
Figures 2, 6D:
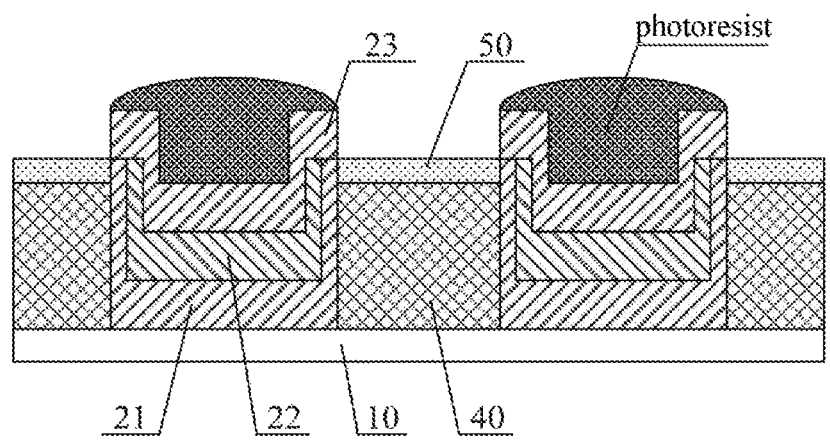
Figures 2, 6E:
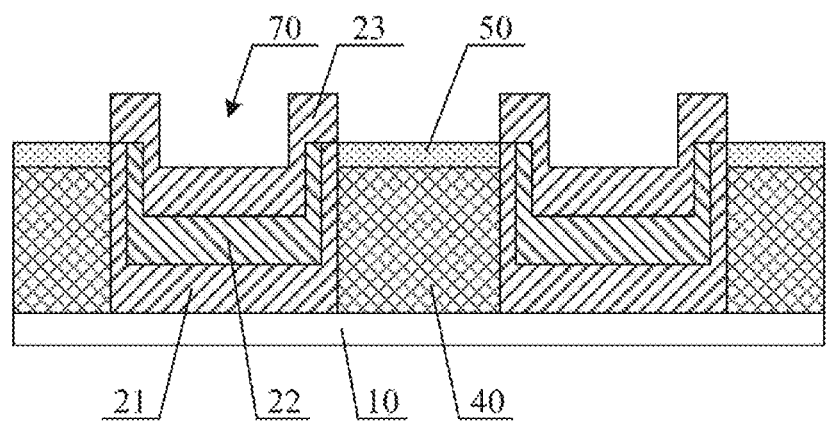
Figure 7:
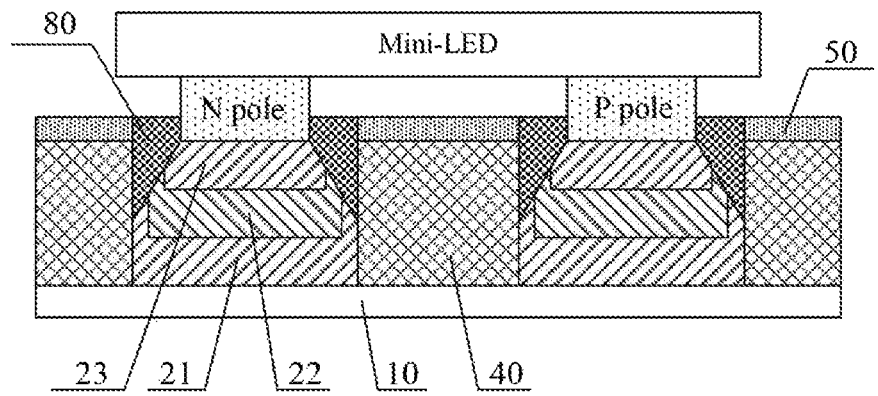
Figure 8:
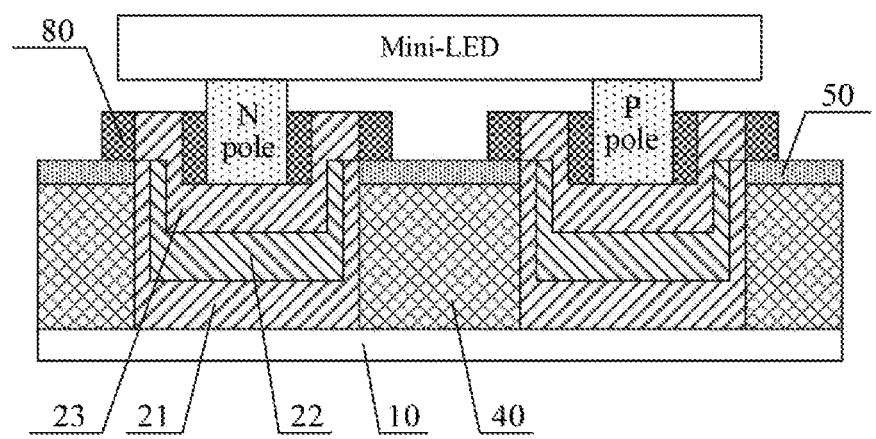

S26: sequentially executing S21 to S24 for the third time to form structures as shown in FIGS. 6a, 6b, 6c-1, 6d-1 and 6e-1, respectively. As shown in FIG. 6e-1, the third metal sub-layer 23 is stacked on the second metal sub-layer 22. 23' represents the third copper metal thin film.

After S21 to S24 are repeatedly executed three times, a 3 μm copper metal trace is formed, as shown in FIG. 6e-1. The copper metal trace includes the first metal sub-layer 21, the second metal sub-layer 22 and the third metal sub-layer 23 which are sequentially stacked, and the copper metal trace is positioned in the groove.

A person skilled in the art can understand that in FIG. 6c-1, when the copper metal thin film is etched by a wet etching process, over-etching will occur between the photoresist and the passivation layer 50, thus finally forming a copper metal trace pattern as shown in FIG. 6e-1, and forming a trough 60 between the copper metal trace and the sidewall of the groove.

Figures 1, 2, 3, 4, 5, 6, 7:
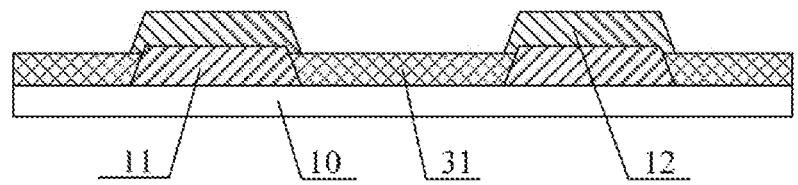

FIG. 7 is a schematic structural diagram of a Mini-LED after being electrically connected with the copper metal trace in FIG. 6e-1. As shown in FIG. 7, since the thicker copper metal trace is recessed in the groove, a trough 60 is formed between the copper metal trace and the sidewall of the groove. Therefore, when bonding and connecting the Mini-LED to the metal trace, a bonding adhesive 80 can be dispersed in the trough 60. The trough 60 can prevent the short circuit problem caused by the bonding adhesive flowing between adjacent grooves, thus improving the bonding yield. The bonding adhesive 80 may be one of adhesive materials such as solder paste, silver paste and anisotropic conductive adhesive.

According to the preparation method of the backplane of the embodiment of the present disclosure, only one mask exposure process is required in the process of forming the metal trace. Compared with the method shown in FIGS. 1-1 to 1-11, two mask exposure processes are reduced, and the preparation cost of the metal trace is reduced. In addition, the preparation method of the backplane also reduces the times of heating and curing, avoids oxidation of the metal trace in the heating and curing process, maintains the low resistance of the metal trace, and improves the preparation yield and bonding yield of products.

The backplane structure formed by the preparation method of the backplane according to the embodiment of the present disclosure is shown in FIG. 6e-1. The backplane comprises a base substrate 10 and an insulating structure layer provided on the base substrate 10, wherein the insulating structure layer is provided with a groove, a metal trace is provided in the groove, the upper surface of the metal trace is lower than the upper surface of the insulating structure layer, and a trough 60 is provided between the metal trace and the sidewall of the groove.

An exemplary embodiment of the present disclosure provides a preparation method of a backplane. In an exemplary embodiment, in order to obtain a copper metal trace with a thickness of 3 μm, the metal sub-layer forming step is repeated twice. Therefore, step S2 may include: sequentially executing S21 to S24 for the first time to obtain structures as shown in FIGS. 4a, 4b, 4c, 4d and 4e, respectively; and sequentially executing S21 to S24 for the second time to obtain the structures as shown in FIGS. 5a, 5b, 5c, 5d and 5e, respectively.

FIG. 6c-2, FIG. 6d-2 and FIG. 6e-2 are schematic structural diagrams of the process of forming a third metal sub-layer in an exemplary embodiment, respectively. In an exemplary embodiment, the preparation method of the backplane may further include step S3: forming a third metal sub-layer on the second metal sub-layer. The step S3 may include the following operations S31-S34.

S31: depositing a third copper metal thin film 23' on the base substrate 10 on which the second metal sub-layer is formed, as shown in FIG. 6a. The thickness of the third copper metal thin film is 1 μm.

S32: forming a photoresist having a flat surface on the third copper metal thin film 23' by coating, as shown in FIG. 6b.

S33: processing the photoresist by a mask exposure process to remove the photoresist positioned outside the groove and retain the photoresist positioned at the groove, as shown in FIG. 6c-2.

S34: etching the third copper metal thin film by a wet etching process to remove the third copper metal thin film positioned outside the groove, as shown in FIG. 6d-2; and peeling the remaining photoresist to form a third metal sub-layer positioned inside the groove, as shown in FIG. 6e-2.

Figures 1, 2, 3, 4, 5, 6, 7, 8:
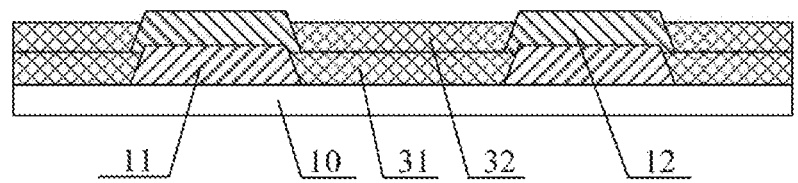
Figures 1, 2, 3, 4, 5, 6, 7, 8, 9:
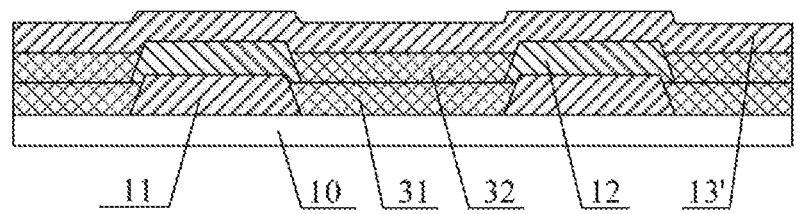
Figures 1, 2, 3, 4, 5, 6, 7, 8, 9, 10:
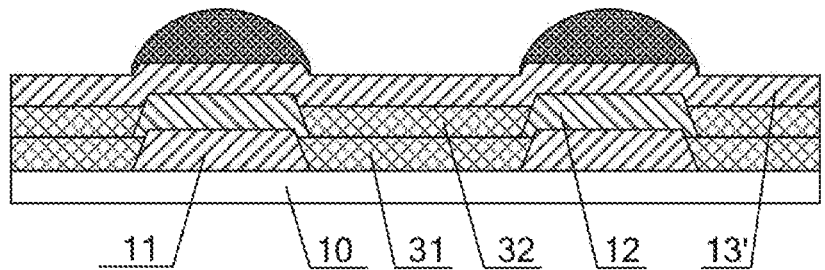
Figures 1, 2, 3, 4, 5, 6, 7, 8, 9, 10, 11:
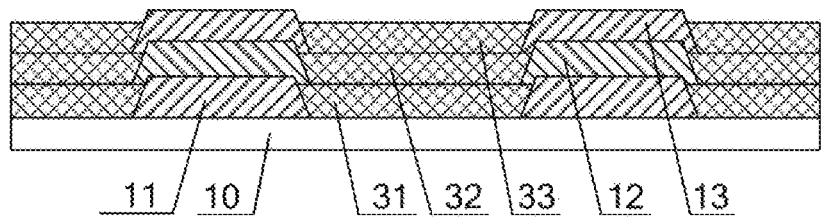
Figure 2:
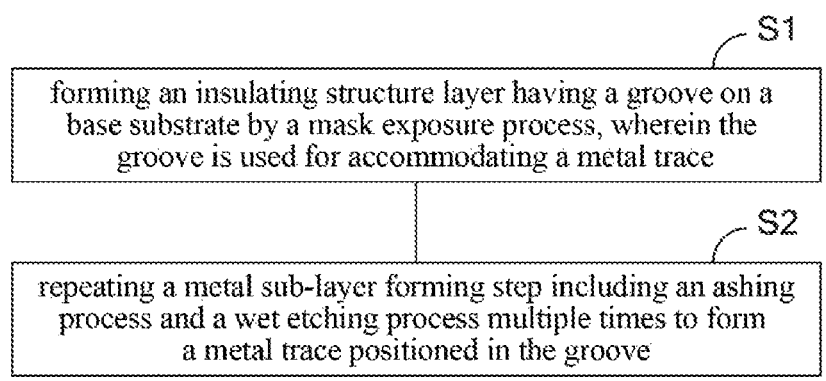

FIG. 8 is a schematic structural diagram of a Mini-LED after being electrically connected with the copper metal trace in FIG. 6e-2. As shown in FIG. 8, the top of the copper metal trace is higher than the surface of the passivation layer 50, and there is a trough 70 at the center of the copper metal trace. Therefore, when bonding and connecting the Mini-LED to the metal trace, the trough 70 can increase the contact area between the copper metal trace and the bonding adhesive 80, enhance the adhesion between the copper metal trace and the bonding adhesive 80, and the poles of the Mini-LED can be bonded in the trough 70, thereby enhancing the bonding firmness of the Mini-LED. The bonding adhesive 80 may be one of adhesive materials such as solder paste, silver paste and anisotropic conductive adhesive.

According to the preparation method of the backplane of the embodiment of the present disclosure, in the process of forming a metal trace, two mask exposure processes are required. Compared with the method shown in FIGS. 1-1 to 1-11, one mask exposure process is reduced, and the preparation cost of the metal trace is reduced. In addition, in the process of etching the third metal thin film in the preparation method of the backplane, the overall sacrifice of the metal near the sidewall of the groove is reduced, and the wire resistance of the finally obtained metal trace is lower. In addition, the preparation method of the backplane also reduces the times of heating and curing, avoids oxidation of the metal trace in the heating and curing process, maintains the low resistance of the metal trace, and improves the preparation yield and bonding yield of products.

The backplane structure formed by the preparation method of the backplane according to the embodiment of the present disclosure is shown in FIG. 6e-2. The backplane comprises a base substrate 10 and an insulating structure layer provided on the base substrate 10, wherein the insulating structure layer is provided with a groove, a metal trace is provided in the groove, the upper surface of the metal trace is higher than the upper surface of the insulating structure layer, and a trough 70 is provided at the center of the metal trace.

An embodiment of the present disclosure provides a backlight module. The backlight module comprises a backplane formed by using an aforementioned embodiment, and also comprises a Mini-LED provided on the backplane and electrically connected with a metal trace, as shown in FIG. 7 or FIG. 8.

An embodiment of the present disclosure also provides a display device, comprising the backlight module according to an aforementioned embodiment. The display device may be any product or component with a display function, such as a mobile phone, a tablet computer, a television, a display, a notebook computer, a digital photo frame, a navigator.

In the description of the embodiments of the present disclosure, it should be understood that, an orientational or positional relationship indicated by terms "middle", "upper", "lower", "front", "rear", "vertical", "horizontal", "top", "bottom", "inner", "outside" or the like is based on the orientational or positional relationship shown in the drawings, which is only for ease of description of the present disclosure and simplification of the description, rather than indicating or implying that the stated device or element must have a specific orientation, or be constructed and operated in a particular orientation, and therefore cannot be understood as limiting the present disclosure.

In the description of the embodiments of the present disclosure, it should be noted that terms "install", "join" and "connect" shall be broadly understood unless otherwise explicitly specified and defined. For example, it may be a fix connection, a removable connection, or an integral connection; it may be a mechanical connection or an electrical connection; it may be a direct connection, or an indirect connection through an intermediate medium, or an internal communication between two elements. Those of ordinary skilled in the art can understand the specific meanings of the above terms in the present disclosure according to specific situations.

Although embodiments of the present disclosure are described in the above, the above embodiments are described only for easy understanding, rather than restricting the present disclosure. Any person skilled in the art to which the present disclosure pertains may make any modifications and variations in the forms and details of implementation without departing from the spirit and the scope disclosed in the present disclosure, but the patent protection scope of the present disclosure should still be subject to the scope defined by the appended claims.

What we claim is:

1. A preparation method of a backplane, comprising:
    forming an insulating structure layer having a groove on a base substrate by a mask exposure process, wherein the groove is used for accommodating a metal trace; and
    repeating a metal sub-layer forming step multiple times to form the metal trace positioned in the groove, wherein the metal sub-layer forming step comprises a step of depositing a metal layer, an ashing process and a wet etching process;
    wherein the forming an insulating structure layer having the groove on the base substrate by the mask exposure process comprises:
    forming an organic thin film on the base substrate;
    forming a passivation thin film on the organic thin film;
    etching the passivation thin film by a first dry etching process to form a first sub-groove for exposing the organic thin film;
    coating a layer of photoresist on the passivation thin film;
    exposing and developing the photoresist by the mask exposure process to make the photoresist positioned outside the first sub-groove be retained and the photoresist at the first sub-groove be removed;
    etching the organic thin film exposed through the first sub-groove by a second dry etching process to form a second sub-groove, wherein the groove comprises the second sub-groove and the first sub-groove;
    wherein a depth of the groove is greater than 3 μm; a trough is formed between the metal trace and a sidewall of the groove; when a LED is bonded and connected to the metal trace, a bonding adhesive is dispersed in the trough.

2. The preparation method according to claim 1, wherein a sidewall of the groove is perpendicular to a surface of the base substrate.

3. The preparation method according to claim 1, wherein the metal sub-layer forming step comprises:
depositing a metal thin film on the base substrate on which the groove is formed;
forming a photoresist layer on the metal thin film;
ashing the photoresist layer to make the photoresist positioned outside the groove be removed and a part of the photoresist at the groove be retained; and
etching the metal thin film by a wet etching process and peeling the remaining photoresist to form a metal sub-layer positioned in the groove.

4. The preparation method according to claim 3, further comprising:
depositing a metal thin film on the base substrate on which the metal sub-layer is formed;
forming a photoresist layer on the metal thin film;
processing the photoresist layer by a mask exposure process to remove the photoresist positioned outside the groove and retain the photoresist at the groove; and
etching the metal thin film by a wet etching process and peeling the remaining photoresist to form another metal sub-layer positioned in the groove.

5. The preparation method according to claim 4, wherein a thickness of the metal thin film is less than or equal to 1 µm.

6. The preparation method according to claim 4, wherein the metal sub-layer forming step is repeated twice.

7. The preparation method according to claim 3, wherein a thickness of the metal thin film is less than or equal to 1 µm.

8. The preparation method according to claim 3, wherein the metal sub-layer forming step is repeated three times.

9. The preparation method according to claim 1, wherein a material of the organic thin film comprises polyimide, and a material of the passivation thin film comprises at least one of silicon nitride, silicon oxide and silicon oxynitride.

10. A backplane prepared by a method comprising:
forming an insulating structure layer having a groove on a base substrate by a mask exposure process, wherein the groove is used for accommodating a metal trace; and
repeating a metal sub-layer forming step multiple times to form the metal trace positioned in the groove, wherein the metal sub-layer forming step comprises a step of depositing a metal layer, an ashing process and a wet etching process;
wherein the forming an insulating structure layer having the groove on the base substrate by the mask exposure process comprises:
forming an organic thin film on the base substrate;
forming a passivation thin film on the organic thin film;
etching the passivation thin film by a first dry etching process to form a first sub-groove for exposing the organic thin film;
coating a layer of photoresist on the passivation thin film;
exposing and developing the photoresist by the mask exposure process to make the photoresist positioned outside the first sub-groove be retained and the photoresist at the first sub-groove be removed;
etching the organic thin film exposed through the first sub-groove by a second dry etching process to form a second sub-groove, wherein the groove comprises the second sub-groove and the first sub-groove;
wherein a depth of the groove is greater than 3 µm; a trough is formed between the metal trace and a sidewall of the groove; when a LED is bonded and connected to the metal trace, a bonding adhesive is dispersed in the trough.

11. The backplane according to claim 10, wherein an upper surface of the metal trace is lower than an upper surface of the insulating structure layer, and a trough is provided between the metal trace and a sidewall of the groove.

12. A backlight module, comprising the backplane of claim 11, and further comprising an LED provided on the backplane and electrically connected to the metal trace.

13. The backplane according to claim 10, wherein an upper surface of the metal trace is higher than an upper surface of the insulating structure layer, and a trough is provided at the center of the metal trace.

14. A backlight module, comprising the backplane of claim 13, and further comprising an LED provided on the backplane and electrically connected to the metal trace.

15. The backplane according to claim 10, wherein a depth of the groove is greater than 3 µm.

16. A backlight module, comprising the backplane of claim 10, and further comprising an LED provided on the backplane and electrically connected to the metal trace.

17. A display device, comprising the backlight module of claim 16.

* * * * *